United States Patent
Kurokawa et al.

(10) Patent No.: US 9,543,836 B2
(45) Date of Patent: Jan. 10, 2017

(54) CONTROL DEVICE OF A POWER CONVERSION CIRCUIT

(71) Applicants: NAGASAKI UNIVERSITY, Nagasaki-shi, Nagasaki (JP); PANASONIC CORPORATION, Kadoma-shi, Osaka (JP)

(72) Inventors: Fujio Kurokawa, Nagasaki (JP); Masahito Ohnishi, Kadoma (JP)

(73) Assignees: NAGASAKI UNIVERSITY, Nagasaki-shi, Nagasaki (JP); PANASONIC CORPORATION, Kadoma-shi, Osaka (JP)

( * ) Notice: Subject to any disclaimer, the term of this patent is extended or adjusted under 35 U.S.C. 154(b) by 2 days.

(21) Appl. No.: 14/404,890

(22) PCT Filed: May 31, 2013

(86) PCT No.: PCT/JP2013/065286
§ 371 (c)(1),
(2) Date: Dec. 1, 2014

(87) PCT Pub. No.: WO2013/180297
PCT Pub. Date: Dec. 5, 2013

(65) Prior Publication Data
US 2015/0155778 A1    Jun. 4, 2015

(30) Foreign Application Priority Data

May 31, 2012    (JP) .................................. 2012-125428

(51) Int. Cl.
*H02M 3/156* (2006.01)
*H02M 1/00* (2006.01)
*H02M 1/42* (2007.01)

(52) U.S. Cl.
CPC ............... *H02M 3/156* (2013.01); *H02M 1/42* (2013.01); *H02M 1/4225* (2013.01);
(Continued)

(58) Field of Classification Search
CPC   H02M 3/156; H02M 1/42; H02M 2001/0009; H02M 2001/4291; H02M 1/4225; H02M 3/155; H02M 3/1588; H02M 2001/0058; H02M 1/083; Y02B 70/1466
See application file for complete search history.

(56) References Cited

U.S. PATENT DOCUMENTS

| 2009/0021968 A1* | 1/2009 | Komatsu | H02M 3/33507 363/126 |
| 2010/0264839 A1* | 10/2010 | Kurokawa | H05B 41/2828 315/224 |

(Continued)

FOREIGN PATENT DOCUMENTS

| JP | 2001-258269 | 9/2001 |
| JP | 2006-527980 | 12/2006 |

(Continued)

OTHER PUBLICATIONS

International Search Report for International Application No. PCT/JP2013/065286, dated Nov. 12, 2013.

*Primary Examiner* — Gustavo Rosario Benitez
(74) *Attorney, Agent, or Firm* — Kile Park Reed & Houtteman PLLC

(57) ABSTRACT

In a control device of a power converter circuit repeating accumulation of energy to an inductor and release of energy from the inductor at each turn on/turn off timing of a switch, a zero cross detecting circuit detects a time when a current flowing through the inductor becomes zero by inputting a voltage between both terminals of the inductor directly without any resistance for detecting the inductor current. There is no electricity loss caused by the resistance for (Continued)

detecting the inductor current and critical mode control of the power converter circuit is precisely carried out.

4 Claims, 20 Drawing Sheets

(52) U.S. Cl.
CPC .............. *H02M 2001/0009* (2013.01); *H02M 2001/4291* (2013.01); *Y02B 70/126* (2013.01)

(56) References Cited

U.S. PATENT DOCUMENTS

| | | | | |
|---|---|---|---|---|
| 2012/0026765 A1* | 2/2012 | Adragna | ............. | H02M 1/4225 |
| | | | | 363/78 |
| 2012/0176108 A1* | 7/2012 | Goto | ................... | H02M 3/1588 |
| | | | | 323/271 |
| 2012/0200273 A1* | 8/2012 | Eom | ....................... | H02M 1/38 |
| | | | | 323/271 |
| 2015/0003129 A1* | 1/2015 | Kurokawa | .............. | H02M 1/42 |
| | | | | 363/89 |
| 2015/0162849 A1* | 6/2015 | Kurokawa | ............ | H02M 3/156 |
| | | | | 363/78 |

FOREIGN PATENT DOCUMENTS

| | | |
|---|---|---|
| JP | 2010-220330 | 9/2010 |
| JP | 2011-223800 | 11/2011 |
| JP | 2012-64431 | 3/2012 |

\* cited by examiner

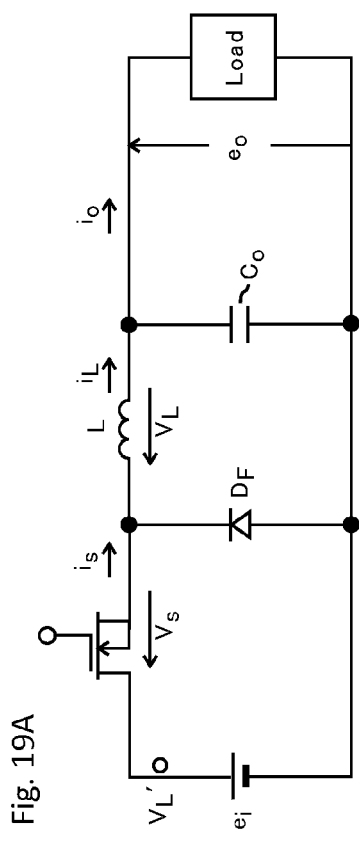
Fig. 19A
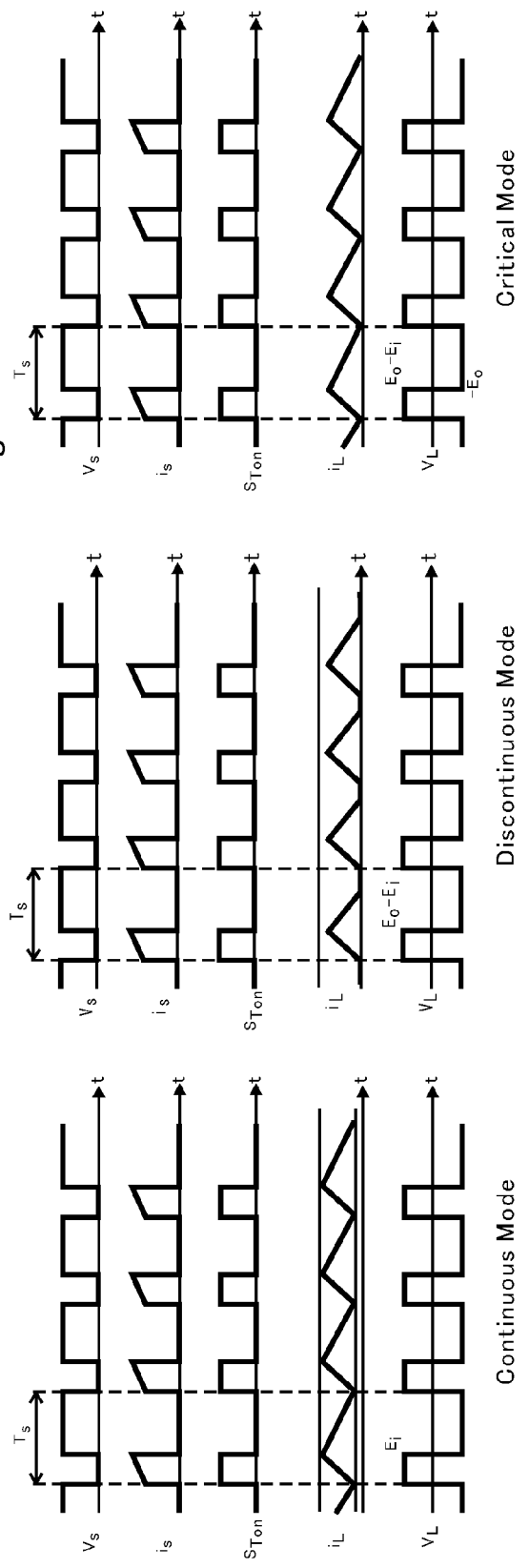
Fig. 19B Continuous Mode
Fig. 19C Discontinuous Mode
Fig. 19D Critical Mode

CONTROL DEVICE OF A POWER CONVERSION CIRCUIT

FIELD OF THE INVENTION

The present invention relates to a control device of a power converter circuit (a DC/DC converter circuit or an AC/DC converter circuit) detecting a zero cross point of an inductor current.

More particularly, the present invention relates to the control device of the power converter circuit that can perform a good critical mode control by detecting a change of the inductor current precisely.

BACKGROUND ART

A control mode of the power converter circuit (a DC/DC converter or an AC/DC converter) includes a continuous mode, a discontinuous mode and a critical mode conventionally (refer to a patent document 1).

The critical mode is a mode of a border between the continuous mode and the discontinuous mode.

FIG. 19 (A) shows a buck type (a step-down type) DC/DC converter.

FIG. 19 (B) shows each waveform in several points of the buck type DC/DC converter working in the continuous mode.

FIG. 19 (C) shows each waveform in several points of the buck type DC/DC converter working in the discontinuous mode.

FIG. 19 (D) shows each waveform in several points of the buck type DC/DC converter working in the critical mode.

'Vs' is a switch voltage, 'is' is a switch current, 'STON' is a switch drive signal, 'iL' is an inductor current and 'VL' is an inductor voltage in FIG. 19 (B), FIG. 19 (C) and FIG. 19 (D).

A power factor in the critical mode (FIG. 19 (D)) is usually higher than a power factor in the continuous mode (FIG. 19 (B)) and a power factor in the discontinuous mode (FIG. 19 (C)).

FIG. 20 shows a conventional power conversion system to work in the critical mode, which comprises a control device 8 and a power converter circuit 9.

In FIG. 20, the power converter circuit 9 is a buck type DC/DC converter. The power converter circuit 9 comprises a DC power supply 911, a switch 912 (a transistor), a flywheel diode 913 (DF), an inductor 914 (L) and a capacitor 915 (CO).

A power input terminal of the switch 912 is connected to a positive terminal of the DC power supply 911.

A cathode terminal of the flywheel diode 913 (DF) is connected to a power output terminal of the switch 912, and an anode terminal is grounded.

A terminal of the inductor 914 (L) is connected to the power output terminal of the switch 912, and another terminal of the inductor 914 (L) is connected to a terminal of the capacitor 915 (CO).

Another terminal of the capacitor 915 (CO) is grounded.

A load 900 is connected to both terminals of the capacitor 915.

A resistance 916 (r0) for detecting an inductor current is connected to the inductor 914.

But, if a secondary winding is provided in the inductor 914, a resistance for detecting the inductor current can be connected to the secondary winding.

In the power converter circuit 9, energy is accumulated to the inductor 914 when the switch 912 is turned on.

On the other hand, the energy accumulated to the inductor 914 is released to the load 900 when the switch 912 is turned off.

The control device 8 includes an on-time information generation circuit 81, a zero cross detecting circuit 82 and a PWM signal generation circuit 83.

The on-time information generation circuit 81 receives a power converter circuit information INF including at least an output voltage value EO of the power converter circuit 9, and the on-time information generation circuit 81 generates the on-time information NTON of the switch 912.

An output voltage eO of the power converter circuit 9 is converted to a digital signal (the output voltage EO) by an A/D converter 801, and the output voltage EO is input to the on-time information generation circuit 81.

The on-time information generation circuit 81 is typically a PID control circuit. The on-time information generation circuit 81 can send the on-time information NTON (a numerical value) to the PWM signal generation circuit 83 for each switching cycle.

For example, the on-time information generation circuit 81 sends the on-time information NTON to the PWM signal generation circuit 83 depending on a request from the PWM signal generation circuit 83.

A voltage Vr0 occurs between two terminals of the resistance 916 (r0) serially connected to the inductor 914.

The zero cross detecting circuit 82 inputs the voltage Vr0.

The zero cross detecting circuit 82 detects a time when a current flowing through the inductor 914 (an inductor current iL) becomes zero.

The zero cross detecting circuit 82 generates and sends a zero cross detection signal ZCRSS to the PWM signal generation circuit 83 when the inductor current iL becomes zero.

When the zero cross detection signal ZCRSS is received, the PWM signal generation circuit 83 sends a turn on signal TRNON to a driver 802.

The PWM signal generation circuit 83 generates and sends a turn off signal TRNOFF to the driver 802 when a time based on the on-time information NTON passed after the PWM signal generation circuit 83 sent the turn on signal TRNON.

The driver 802 drives the switch 912 based on the switch drive signal STON.

PRIOR ART DOCUMENTS

Patent Documents

Patent Document 1:
WO2010/023978
(JP 2010-023978)

DISCLOSURE OF INVENTION

Problem to be Solved by the Invention

In the power converter circuit 9 shown in FIG. 20, a power loss by the resistance 916 (r0) occurs.

If the time when an inductor current iL becomes zero can be detected without using the resistance 916, the power loss will not occur.

The time when the inductor current iL becomes zero may be detected by measuring an inductor voltage VL of the inductor 914.

The relation of the inductor voltage VL and the inductor current iL is represented by a formula (1).

$$VL = -(diL/dt) \qquad (1)$$

However, the inductor current iL is not decided by integrating the formula (1) because the integration constant is uncertain.

An object of the invention is to provide a control device of a power converter circuit that is controlled in the critical mode by acquiring the time when the inductor current becomes zero without any detecting resistance.

Means for Solving Problem

A control device of the present invention assumes the following subject matter.

(1)

A control device of a power converter circuit which has an inductor and a switch or switches and repeats accumulation of energy to an inductor at each turn on timing of the switch or switches and release of the energy from the inductor to output an output voltage at each turn off timing of the switch or switches, comprising:

an on-time information generation circuit which receives a power converter circuit information including at least the output voltage from the power converter circuit, and generates an on-time information of the switch or switches as a numerical number;

a zero cross detecting circuit which detects a time when a current flowing through the inductor becomes zero by inputting a voltage between both terminals of the inductor, and generates a zero cross detection signal when the current becomes zero;

a PWM signal generation circuit which receives the on-time information and the zero cross detection signal, and generates a turn on signal and a turn off signal, wherein the zero cross detecting circuit comprises an edge detecting circuit and a differential circuit, the differential circuit is placed in input side of the edge detecting circuit, and the zero cross detecting circuit generates the zero cross detecting signal when the edge detecting circuit detects an edge of the voltage between both terminals of the inductor based on a differential voltage signal generated by the differential circuit, and the PWM signal generation circuit generates the turn on signal when the zero cross detecting signal is received, and generates the turn off signal when a time based on the on-time information is passed.

The power converter circuit may be a DC/DC converter or an AC/DC converter.

The DC/DC converter may be a buck type, a boost type (a step-up type) or a boost/buck type.

Two power converter circuits may be connected in series.

In this case, the control device of the present invention is connected to each power converter circuit respectively, or the control device of the present invention is connected to a power converter circuit and a control device that is not of the present invention is connected to another power converter circuit.

In the case that the power converter circuit is an AC/DC converter, a DC/DC converter is connected to output terminals of the rectifying circuit.

The output signal of the rectifying circuit is typically a pulsating current.

The DC/DC converter converts the pulsating current of the rectifying circuit to a stable direct current.

An A/D converter circuit is provided in input side of the control device.

The A/D converter circuit converts "the predetermined signal" of the power converter circuit to a digital value from an analog value, and outputs the converted digital value as a power converter circuit information.

"The predetermined signal" of the power converter circuit includes an output voltage, an input voltage, an output current or an input current of the power converter circuit.

An output voltage, an input voltage, an output current or an input current of the power converter circuit can be used to determine the on-time information, and a value of a load resistor can be also used to determine the on-time information.

A driver is provided in output side of the control device.

The driver receives a turn on signal, and generates a drive signal to turn on the switch.

The driver also receives a turn off signal, and generates a drive signal to turn off the switch.

(2)

The control device of the power converter circuit according to (1):

wherein the edge detecting circuit comprises a constant voltage circuit and a flip-flop circuit.

(3)

The control device of the power converter circuit according to (1):

wherein a differential amplification circuit is provided in input side of the differential circuit.

(4)

The control device of the power converter circuit according to (1):

wherein the current flowing through the inductor is controlled to be zero for a predetermined time.

Effect of the Invention

In the control device of the present invention, the edge detecting circuit can detect the time when the inductor current becomes zero precisely without any detecting resistance.

Thus, the control device can perform a good critical mode control.

In the control device of the present invention, the differential circuit can be provided in input side of the edge detecting circuit.

An edge of the inductor voltage can be thereby detected more precisely.

Even more particularly, in the control device of the present invention, the differential amplification circuit can be provided in input side of the differential circuit.

In this case, an edge of the inductor voltage can be detected precisely even if a gain of the differential circuit is low.

BRIEF DESCRIPTION OF DRAWINGS

FIG. 19 (A) is a figure showing a buck type DC/DC converter.

FIG. 19 (B) is a wave form chart showing a waveform of each part in a continuous mode.

FIG. 19 (C) is a wave form chart showing a waveform of each part in a discontinuous mode.

FIG. 19 (D) is a wave form chart showing a waveform of each part in a critical mode.

THE BEST MODE FOR CARRYING OUT THE INVENTION

Figure 1:
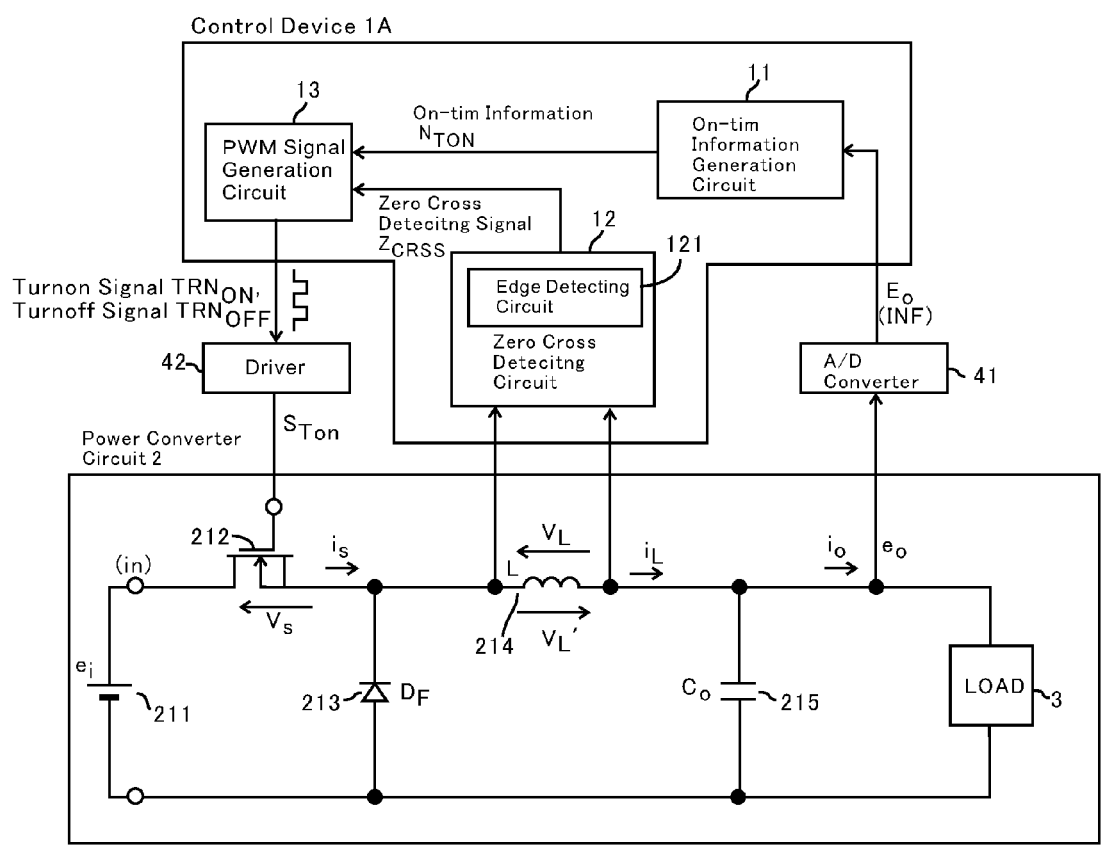
FIG. 1 is a figure showing a first embodiment of a control device of the present invention wherein a zero cross detecting circuit comprises an edge detecting circuit.

FIG. 1 is a figure showing a first embodiment of a control device of a power converter circuit of the present invention.

A power converter circuit 2 comprises a DC power supply 211, a switch 212 (a transistor), a flywheel diode 213 (DF), an inductor 214 and a capacitor 215.

The switch 212 (a transistor) is connected to the DC power supply 211.

A cathode of the flywheel diode 213 (DF) is connected to the switch 212, and an anode of that is grounded.

The inductor 214 is connected to the switch 212.

A terminal of the capacitor 215 is connected to the inductor 214, and another terminal is grounded.

A load 3 is connected to both ends of the capacitor 215.

In the power converter circuit 2, energy is accumulated when the switch 212 is turned on, and the accumulated energy is released to the load 3 when the switch 212 is turned off.

The control device 1A includes an on-time information generation circuit 11, a zero cross detecting circuit 12 and a PWM signal generation circuit 13.

The on-time information generation circuit 11 receives a power converter circuit information INF including an output voltage digital value EO of the power converter circuit 2, and generates an on-time information NTON of the switch 212.

In the present embodiment, the power converter circuit information INF is an output voltage digital value EO of the power converter circuit 2.

The present invention is not limited to the control device 1A of the embodiment of FIG. 1. For example, a digital value EO of the output voltage eO and at least one of a digital value EI of an input voltage ei or a digital value IO of an output current iO are input to the control device through A/D converters, and the control device can generate the on-time information NTON based on these input values.

The output voltage eO of the power converter circuit 2 is converted to the digital value EO by an A/D converter 41, and the digital value EO is input to the on-time information generation circuit 11.

The on-time information generation circuit 11 is a PID control circuit and a digital filter (IIR, FIR).

The on-time information (a numerical value, in the present embodiment) can be sent out to the PWM signal generation circuit 13 at each switching cycle.

For example, the on-time information generation circuit 11 sends the on-time information to the PWM signal generation circuit 13 depending on a request from the PWM signal generation circuit 13.

In this case, the on-time information generation circuit 11 can start to generate an on-time information in the next switching cycle when the on-time information was sent.

The zero cross detecting circuit 12 inputs a terminal voltage (an inductor voltage VL') of an inductor 214, and detects the timing when a current flowing through the inductor 214 (an inductor current iL) becomes zero and generates a zero cross detection signal ZCRSS.

The zero cross detecting circuit 12 has an edge detecting circuit 121 which detects an edge of the inductor voltage VL' as the inductor current iL becomes zero.

Note that, in FIG. 1, the inductor voltage VL' is a back electromotive force of the inductor 214.

The absolute value of VL' is the same as the absolute value of VL.

A plus or minus sign of VL and VL'(VL=−VL') are reverse.

The PWM signal generation circuit 13 receives the on-time information and the zero cross detection signal, and generates a turn on signal TRNON and a turn off signal TRNOFF.

Specifically, the PWM signal generation circuit 13 generates the turn on signal TRNON when the zero cross detection signal ZCRSS is received.

In addition, the PWM signal generation circuit 13 generates the turn off signal TRNOFF after a time based on the on-time information NTON passed.

The turn on signal TRNON and the turn off signal TRNOFF are sent to the driver 42, and the driver 42 drives the switch 212 based on the switch drive signal STON.

Figure 2:
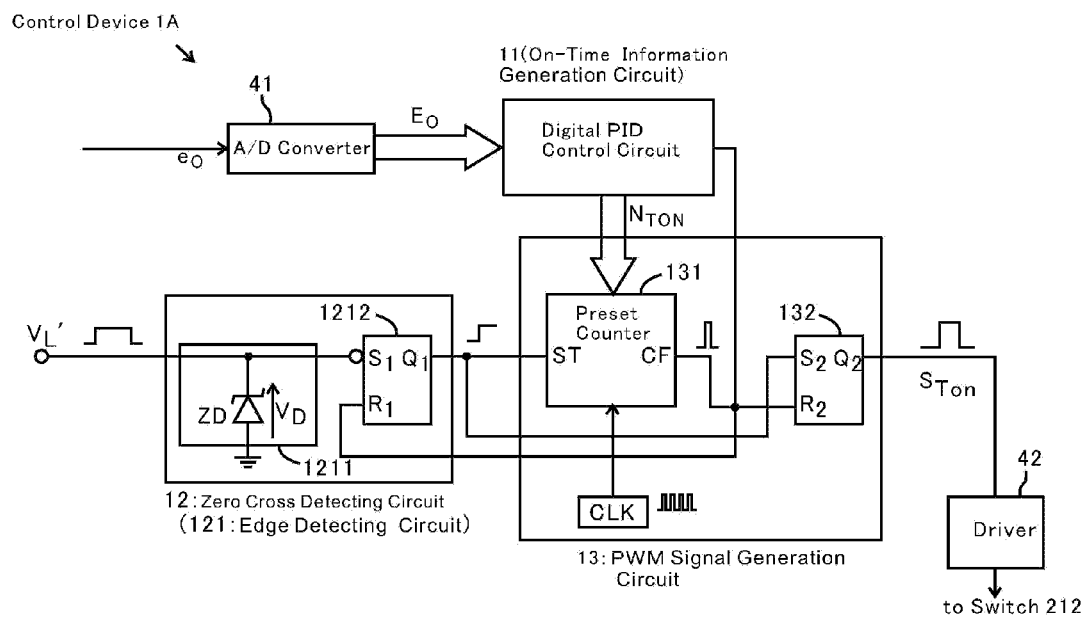
FIG. 2 is a figure showing the control device of FIG. 1 specifically.

FIG. 2 is a figure showing the control device 1A of FIG. 1 specifically.

The A/D converter 41 converts an analog output voltage eO into a digital value (a digital output voltage value EO).

In FIG. 2, the on-time information generation circuit 11 is a digital PID control circuit.

The on-time information generation circuit 11 inputs the digital output voltage value EO and generates the on-time information NTON.

The zero cross detecting circuit 12 comprises a constant voltage circuit 1211 and a flip-flop circuit 1212.

The edge emerging in the inductor voltage VL' of the inductor 214 is input to a set terminal S1 of the flip-flop circuit 1212 through the constant voltage circuit 1211.

When a falling edge is input to the set terminal S1, the flip-flop circuit 1212 outputs a high level signal from an output terminal Q1.

The falling edge of the inductor voltage VL' is the time when the inductor current IL becomes zero.

The PWM signal generation circuit 13 comprises a preset counter 131 and a flip-flop circuit 132.

The on-time information NTON is preset to the preset counter 131.

The output terminal Q1 of the flip-flop circuit 1212 is connected to an input terminal ST of the preset counter 131.

The preset counter 131 starts counting when a rising edge of the high level signal from the output terminal Q1 is input to the input terminal ST, and outputs a count end signal (a pulse) from an output terminal CF when a count value has reached the pre-set value.

In addition, the output terminal Q1 of the flip-flop circuit 1212 is connected to an input terminal S2 of the flip-flop circuit 132.

The flip-flop circuit 132 outputs a high level signal from an output terminal Q2 when the rising edge of the high level signal from the output terminal Q1 is input to the set terminal S2.

The output terminal CF of the preset counter 131 is connected to a reset terminal R1 of the flip-flop circuit 1212 of the zero cross detecting circuit 12.

The flip-flop circuit 1212 is reset by the rising edge of the count end signal (a pulse) from the output terminal CF.

In addition, the output terminal CF of the preset counter 131 is connected to a reset terminal R2 of the flip-flop circuit 132.

The flip-flop circuit 132 is reset by the rising edge of the count end signal (a pulse) from the output terminal CF.

Thus, the switch drive signal STON, which rises up at the falling edge of the inductor voltage VL' and has a time width based on the on-time information NTON, is output to the driver 42 from the flip-flop circuit 132.

An operation of the control device 1A of FIG. 2 is described as follows.

(1) The constant voltage circuit 1211 inputs the inductor voltage VU.

(2) The output of the constant voltage circuit 1211 is input to the set terminal (S1) of the flip-flop circuit 1212

(3) The flip-flop circuit 1212 detects a falling edge of the inductor voltage VL', and the flip-flop circuit 1212 outputs a high level signal from the output terminal Q1.

(4) The high level signal from the output terminal Q1 is input to the input terminal ST of the preset counter 131 and the set terminal S2 of the flip-flop circuit 132.

(5) When the preset counter 131 inputs the high level signal from the output terminal Q1, the on-time information NTON is preset to the preset counter 131, and the preset counter 131 starts to count.

At the same time, flip-flop circuit 132 outputs a rising edge signal to the driver 42, and the driver 42 turns on the switch 212.

(6) When the preset counter 131 has counted up, the rising edge of the count end signal (a pulse) from the output terminal CF is input to the reset terminal R2 of the flip-flop circuit 132.

Then the flip-flop circuit 132 outputs the falling edge signal to the driver 42, and the driver 42 turns off the switch 212.

Figure 3:
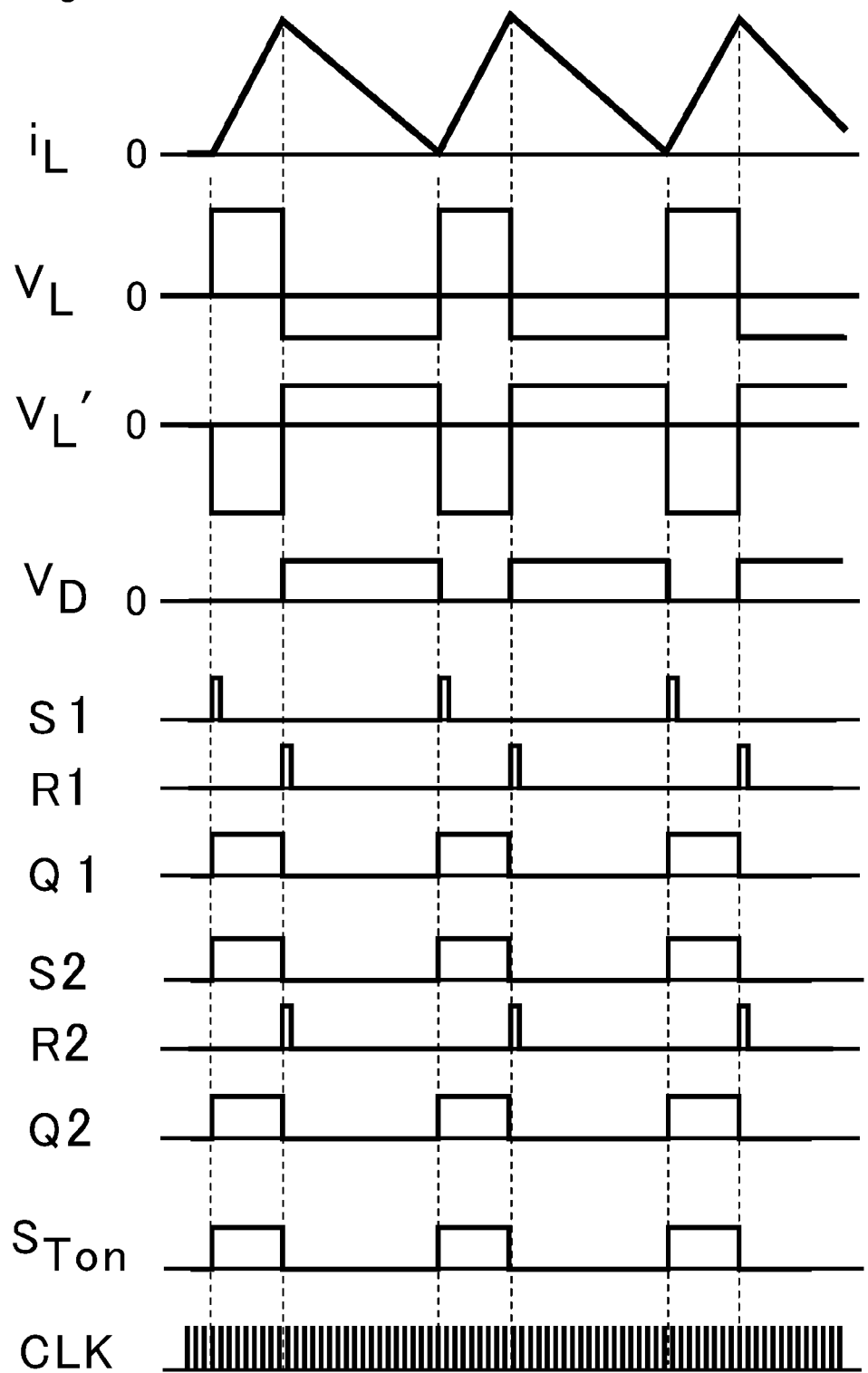
FIG. 3 is a figure showing wave forms of each part of a power converter circuit in FIG. 1.

FIG. 3 shows a waveform chart of each part of the control device 1A and the power converter circuit 2 shown in FIG. 1.

Reference letters in FIG. 3 are as follows.

iL: an inductor current,
VL: an inductor voltage
VL': an inductor voltage which is inversion of VL
VD: an output voltage of the constant voltage circuit 1211
S1: a voltage that is input to the set terminal S1 of the flip-flop circuit 1212
R1: a voltage that is input to the reset terminal R1 of the flip-flop circuit 1212
Q1: a voltage of the output terminal Q1 of the flip-flop circuit 1212
S2: a voltage of the set terminal S2 of the flip-flop circuit 132
R2: a voltage that is input to the reset terminal R2 of the flip-flop circuit 132
Q2: a voltage of the output terminal Q2 of the flip-flop circuit 132
STON: an input of the driver 42 (a voltage of the output terminal Q2 of the flip-flop circuit 132)
CLK: a counting clock of the preset counter 131

Figure 4:
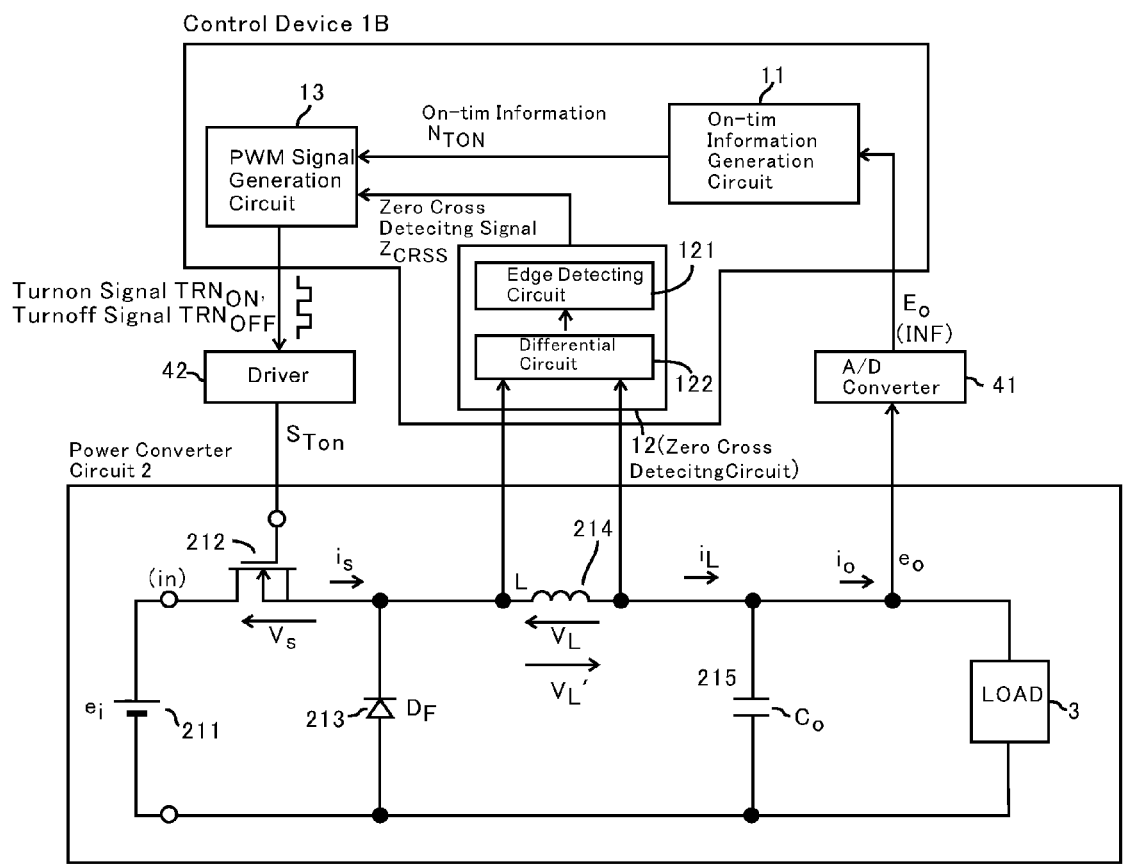
FIG. 4 is a figure showing a second embodiment of the control device of the present invention wherein a zero cross detecting circuit comprises an edge detecting circuit and a differential circuit.

FIG. 4 is a figure that shows a second embodiment of the control device of the present invention.

In this embodiment, the control device is shown by a reference letter 1B.

The power converter circuit 2 is the same as the power converter circuit of FIG. 1.

In a zero cross detecting circuit 12 of the control device 1B, a differential circuit 122 is provided in input side of the edge detecting circuit 121.

The differential circuit 122 inputs a terminal voltage of inductor 214 (an inductor voltage VL') and generates a differential voltage signal VDIF.

The edge detecting circuit 121 can detect surely an edge of the inductor voltage VL' based on the differential voltage signal VDIF.

Figure 5:
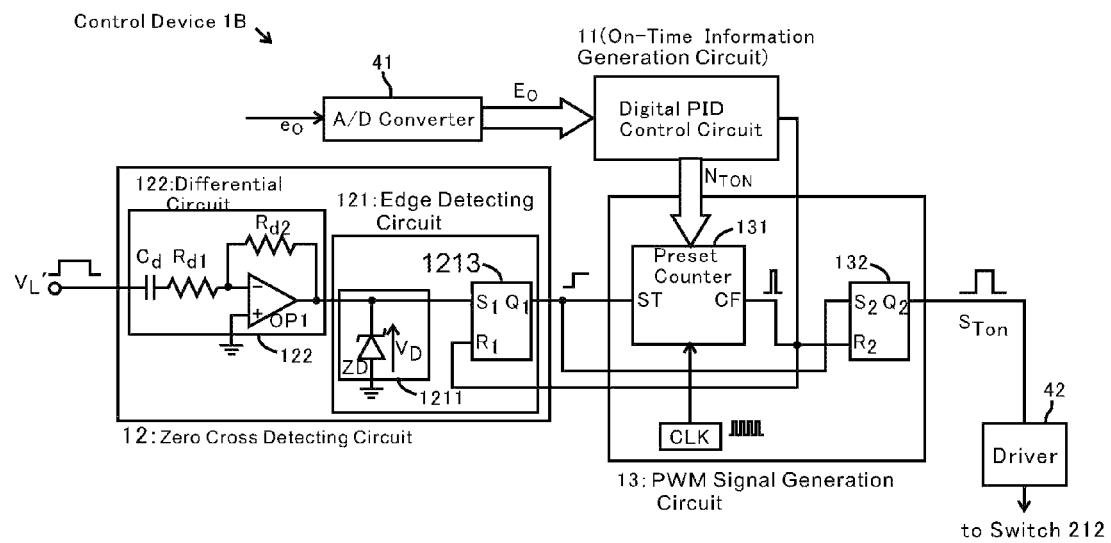
FIG. 5 is a figure showing the control device of FIG. 4 specifically.

FIG. 5 is a figure showing the control device 1B of FIG. 4 specifically.

In FIG. 5, the zero cross detecting circuit 12 comprises the edge detecting circuit 121 and the differential circuit 122.

The edge detecting circuit 121 comprises a constant voltage circuit 1211 and a flip-flop circuit 1213.

The differential circuit 122 of FIG. 5 is a typical differential circuit using an operational amplifier OP1.

In the differential circuit 122, a series circuit of an input capacitor Cd and an input resistance Rd1 is connected to an input terminal of the operational amplifier OP1.

A feedback resister Rd2 is connected between the input terminal and an output terminal of the operational amplifier OP1.

Figure 7:
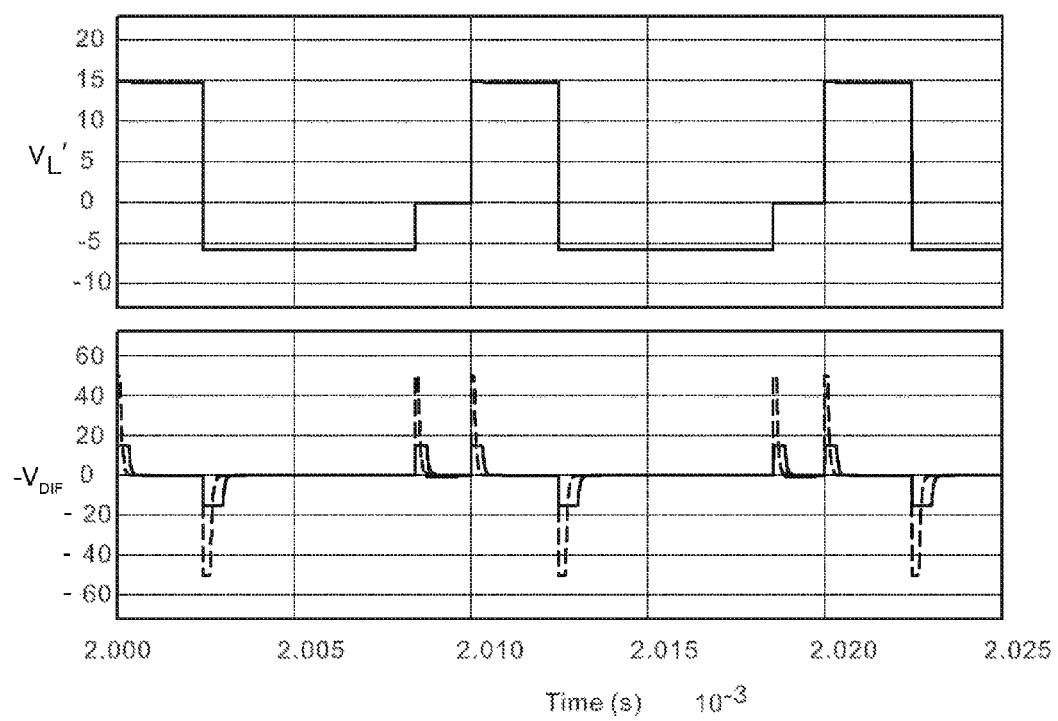
FIG. 7 is a wave form chart showing an inductor voltage and a differential voltage signal in the second embodiment.

A rising edge (or a falling edge) of the inductor voltage VL' is converted to a converted signal, that is a differential voltage signal and has a steep falling edge (or a steep rising edge), by the differential circuit 122 as shown in FIG. 7.

Only the converted signal having a steep rising edge is input to the flip-flop circuit 1213 via a constant voltage circuit 1211.

The flip-flop circuit 1213 outputs a high level signal from the output terminal Q1 when a rising edge is input to the set terminal S1.

The steep rising edge of the converted signal enables to detect the time when the inductor current IL becomes zero more precisely.

An operation of the control device 1B of FIG. 5 after the flip-flop circuit 1213 outputs a high level signal from the output terminal Q1 is the same as the control device 1A of FIG. 2.

Figure 6:
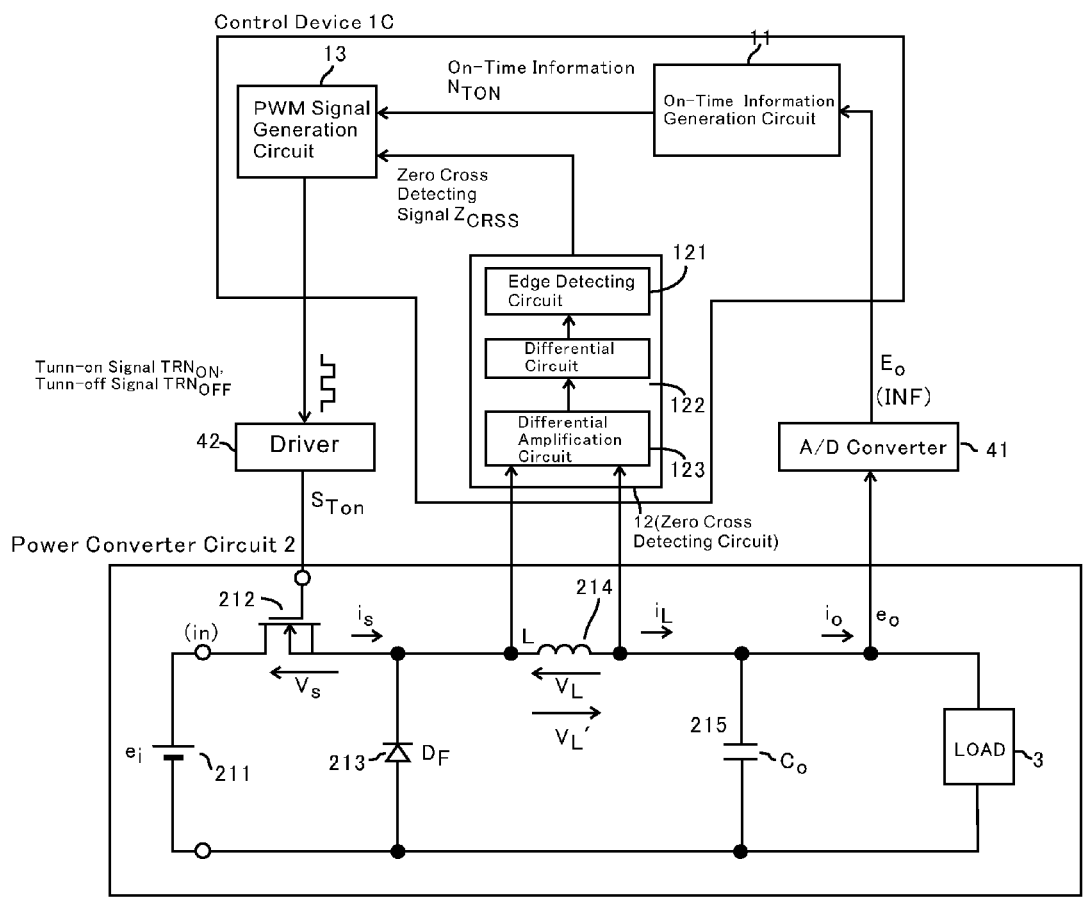
FIG. 6 is a figure showing a third embodiment of the control device of the present invention wherein a zero cross detecting circuit comprises an edge detecting circuit, a differential circuit and a differential amplification circuit.

FIG. 6 is a figure that shows a third embodiment of the control device of the present invention.

In this embodiment, the control device is shown by a reference letter 1C.

The power converter circuit 2 is the same as the power converter circuit of FIG. 1.

In this embodiment, a zero cross detecting circuit 12 of the control device 1C comprises an edge detecting circuit 121, a differential circuit 122 and a differential amplification circuit 123.

The structure of the edge detecting circuit 121 and the differential circuit 122 are the same as the structure explained in the second embodiment.

The differential amplification circuit 123 is connected to an input terminal of the differential circuit 122.

The differential amplification circuit 123 amplifies a terminal voltage (an inductor voltage VL) of the inductor 214.

Figure 8:
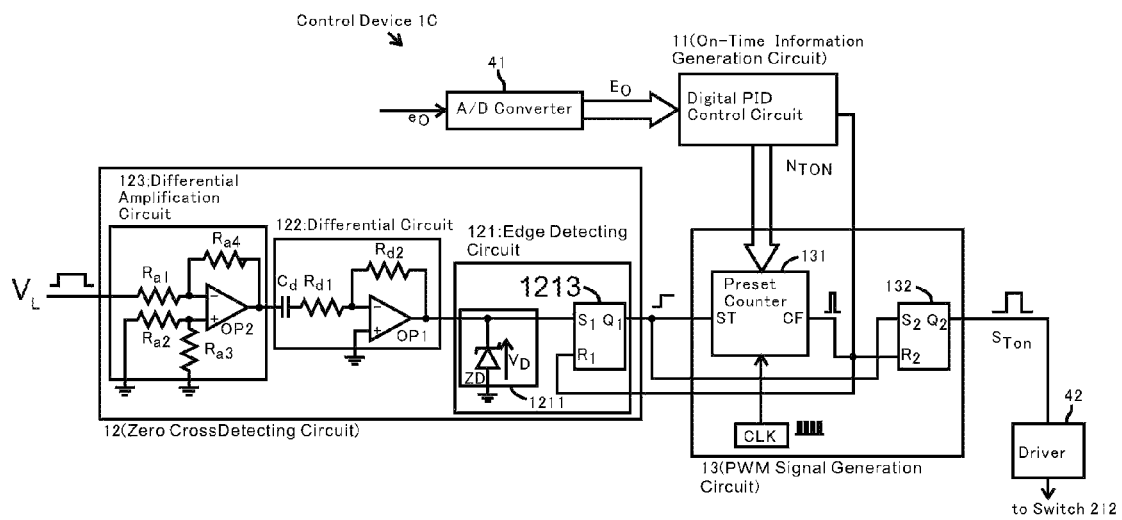
FIG. 8 is a figure showing the control device of FIG. 6 specifically.

FIG. 8 is a figure showing the control device 1C of FIG. 6 specifically.

In FIG. 8, the zero cross detecting circuit 12 comprises the edge detecting circuit 121, the differential circuit 122 and the differential amplification circuit 123.

The differential amplification circuit 123 is a typical circuit using an operational amplifier OP2.

An input resistance Ra1 is connected to an input terminal of the operational amplifier OP2.

A grounding resistance (it comprises a parallel circuit of a resistance Ra2 and a resistance Ra3) is connected to a grounding terminal of the operational amplifier OP2, and a feedback resister Ra4 is connected between the input terminal and an output terminal of the operational amplifier OP2.

The resistance value of Ra1 and the resistance value of Ra2 are set equally, and the resistance value of Ra3 and the resistance value of Ra4 are set equally.

The differential amplification circuit 123 inputs the inductor voltage VL and outputs an amplified signal VL2 of which polarity is reversed to the polarity of VL.

Therefore, a falling edge of VL2 is equivalent to a falling edge of the conductor voltage VL'.

A falling edge of the amplified signal VL2 is converted to a converted signal, that is a differential voltage signal and has a steep rising edge, by the differential circuit 122.

The converted signal is input to the flip-flop circuit 1213 via a constant voltage circuit 1211.

The flip-flop circuit 1213 outputs a high level signal from the output terminal Q1 when a rising edge is input to the set terminal S1.

An operation of the control device 1C of FIG. 8 after the flip-flop circuit 1213 outputs a high level signal from the output terminal Q1 is the same as the control device 1A of FIG. 2.

Figure 9:
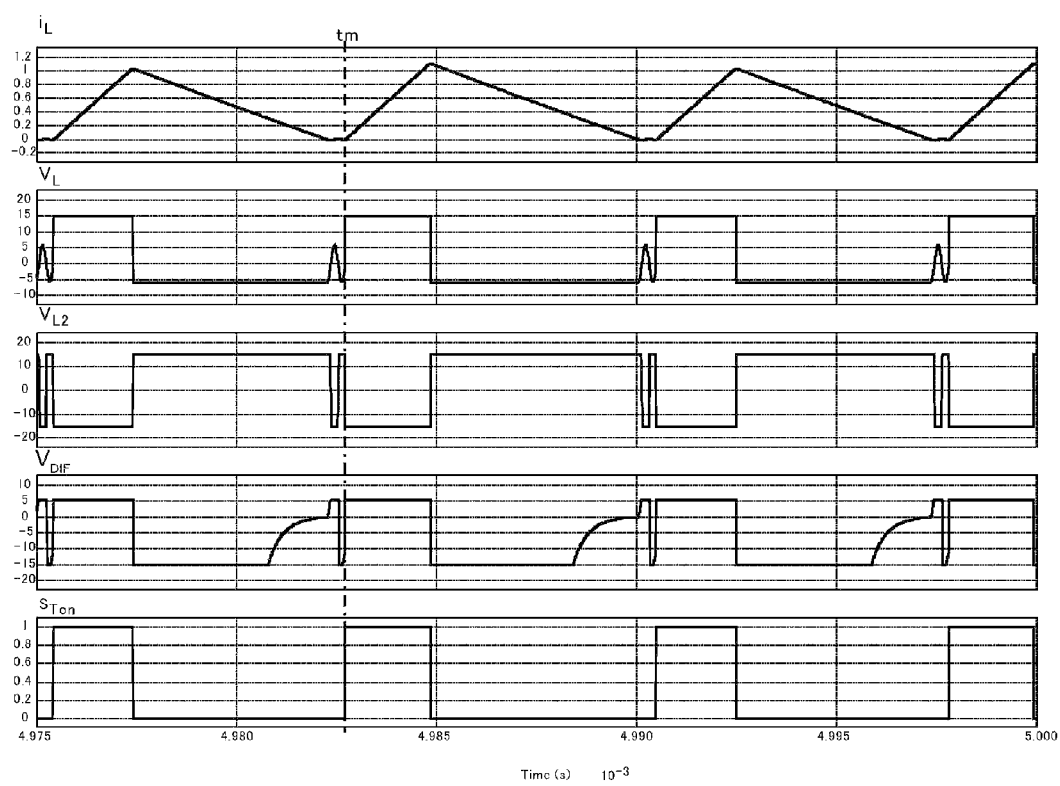
FIG. 9 is a wave form chart showing an inductor current, an inductor voltage and a switch drive signal when a delay of the zero current detection occurs in the third embodiment.

FIG. 9 shows an inductor current iL, an inductor voltage VL, an amplified signal VL2, a differential voltage signal VDIF and a switch drive signal STON.

VL has a triangular shaped portion just before the time 'tm'.

This portion is amplified to be trapezoid shaped in VL2, which has a clear edge.

The falling edge of the trapezoid shaped portion is the time when the inductor current IL becomes zero.

VDIF in FIG. 9 is an undesirable example, because a gain of the differential circuit 122 is too high.

High gain causes a delay of falling edge detection.

Due to a delay of the zero current detection, the critical mode control may become impossible.

Figure 10:
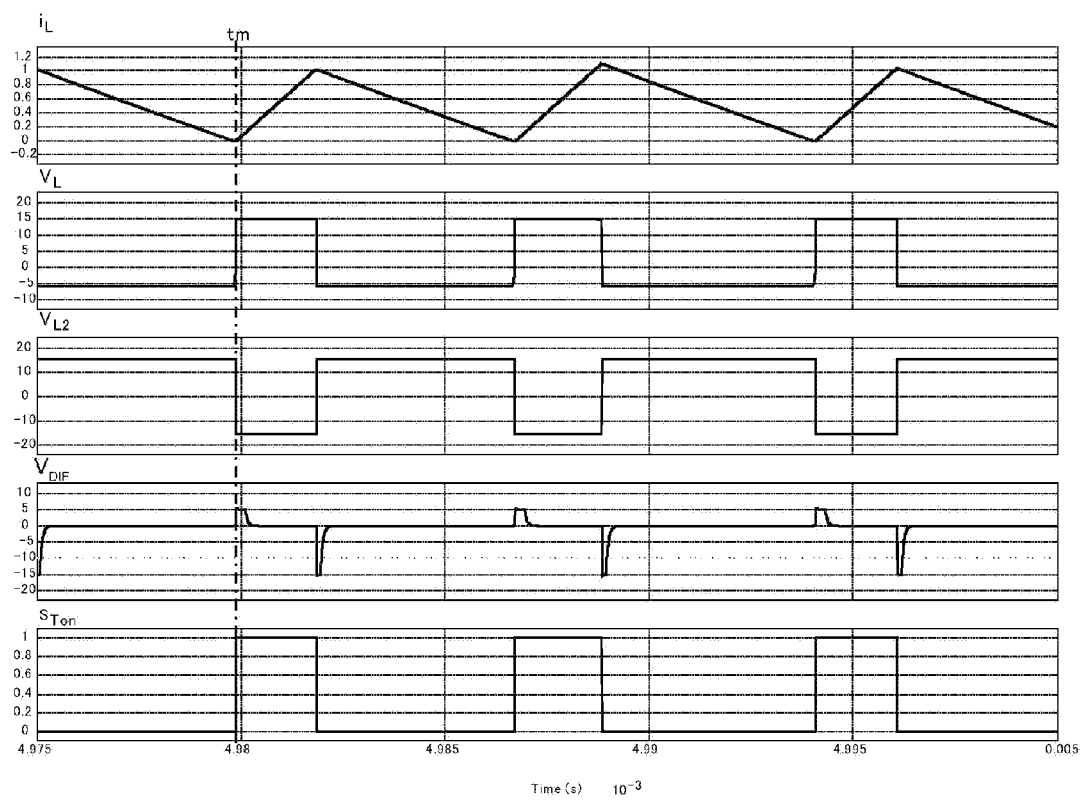
FIG. 10 is a wave form chart showing an inductor current, an inductor voltage and a switch drive signal when a delay of the zero current detection does not occur in the third embodiment.

FIG. 10 is a waveform chart of a case where the detection delay is not because a gain of the differential circuit 122 is properly low.

FIG. 10 shows an inductor current iL, an inductor voltage VL, an amplified signal VL2, a differential voltage signal VDIF and a switch drive signal STON.

The beginning of the falling edge of VL2 is accurately captured as the steep rising edge of VDIF.

A result of the control by a control device 1C of the third embodiment is shown below.

Figure 11:
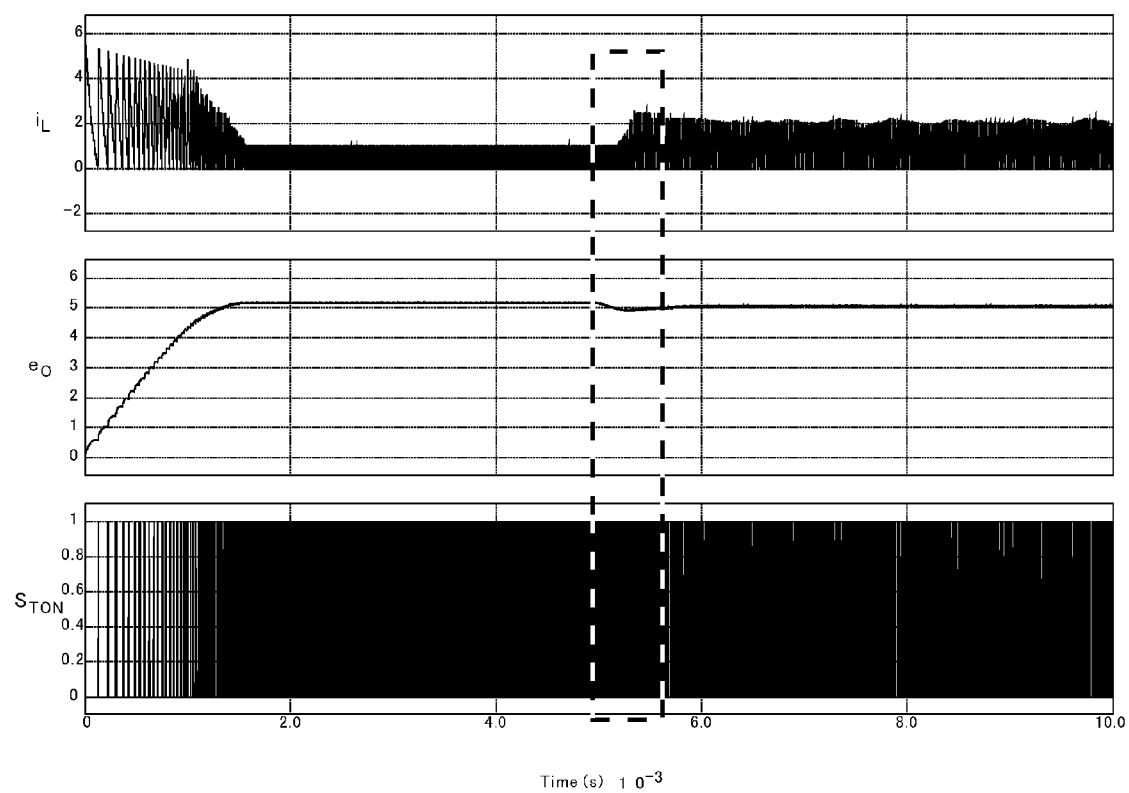
FIG. 11 is a waveform chart showing a control result by the control device of the third embodiment.
Figure 12:
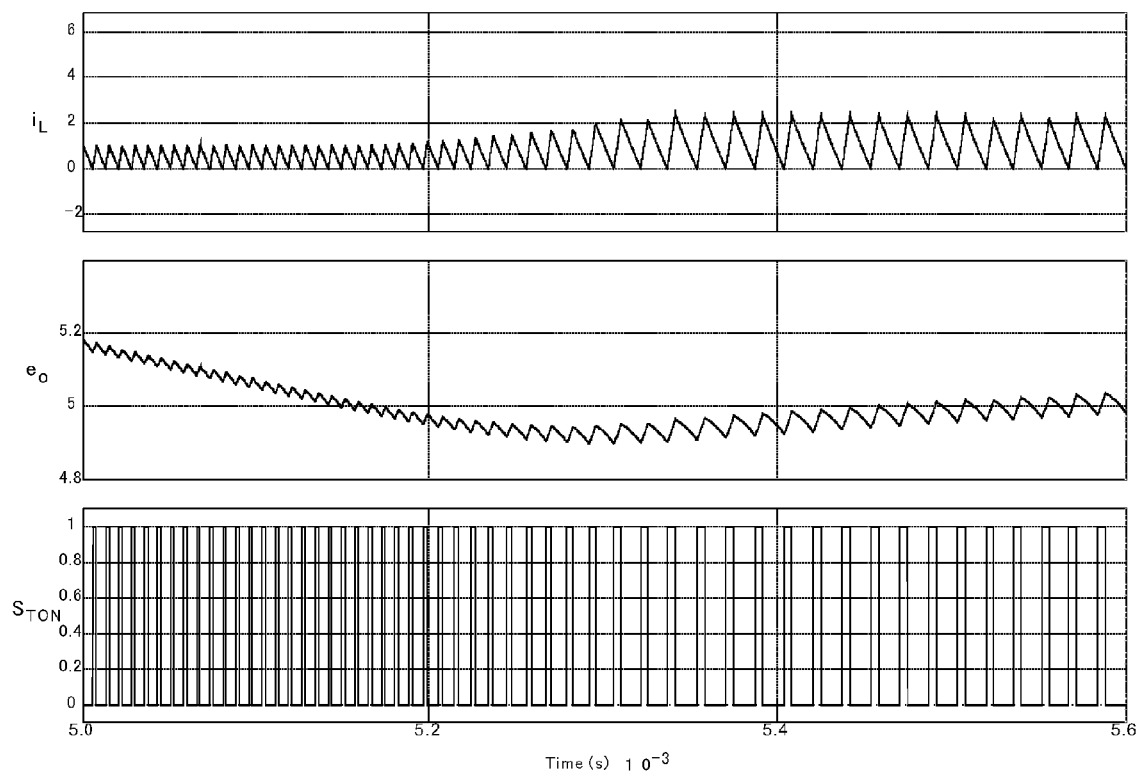
FIG. 12 is a waveform chart showing a control result by the control device of the third embodiment.

FIG. 11 and FIG. 12 show a response of the power converter circuit 2 when the input voltage is 20[V], the output voltage eO is 5[V] and the resistance value of the load 3 varies from 10 [ohm] to 5 [ohm].

FIG. 11 shows the inductor current iL, the output voltage eO, and the switch drive signal STON.

FIG. 12 is an enlarged view of a part of FIG. 11 (an area surrounded in bold line).

As is apparent from FIGS. even if the load changes greatly, the output voltage eO changes slightly and is returned to the steady value immediately.

A time at the inductor current is zero has no width in the complete critical mode like FIG. 10.

However, a very short time period when the inductor current is zero may be preferred in some case, and it is substantially a critical mode.

In the present invention, the control device can control the inductor current to be zero in a certain time period by changing an amplification factor of the amplifier and circuit constants of the differential circuit to adjust the output timing of the zero cross detection signal ZCRSS.

Figure 13:
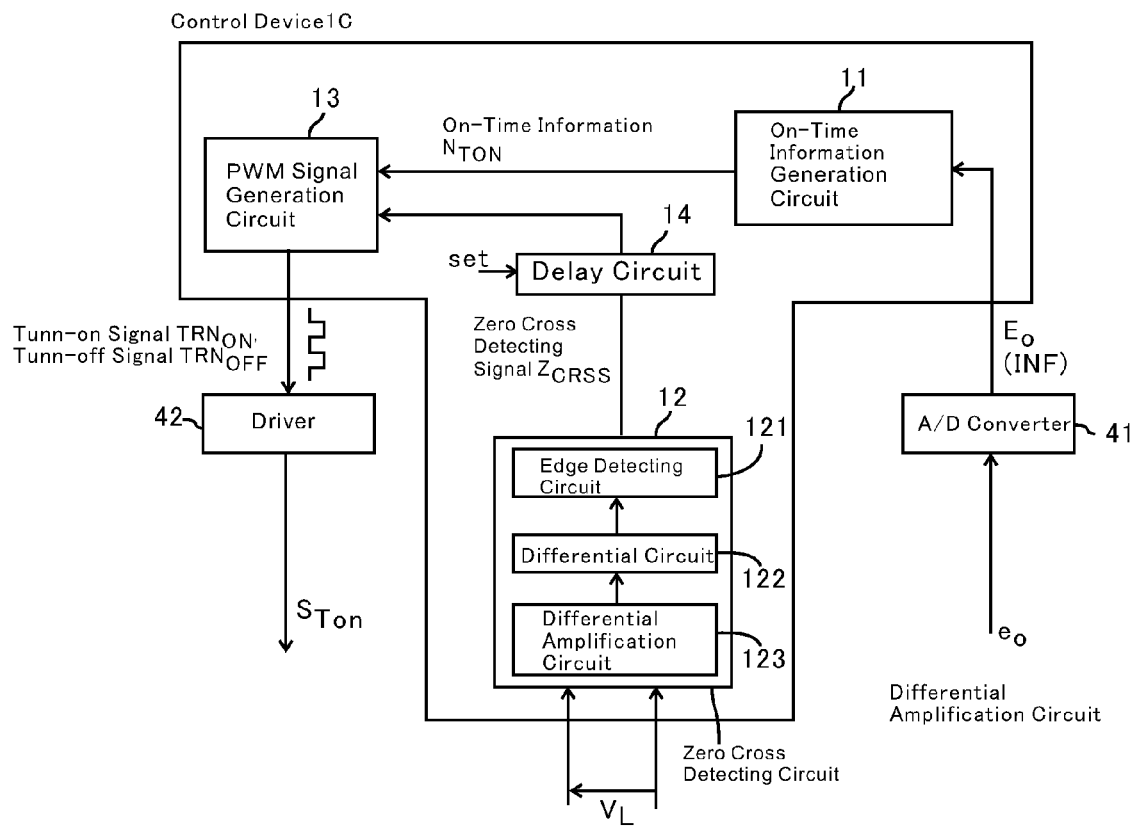
FIG. 13 is a figure showing a control device with a delay circuit provided in output side of the zero cross detecting circuit.

Otherwise, as shown in FIG. 13, the turn on timing of the switch 212 can be delayed by a delay circuit 14 provided in output side of the zero cross detecting circuit 12.

The delay circuit 14 may comprise a preset counter and a flip-flop.

Figure 14:
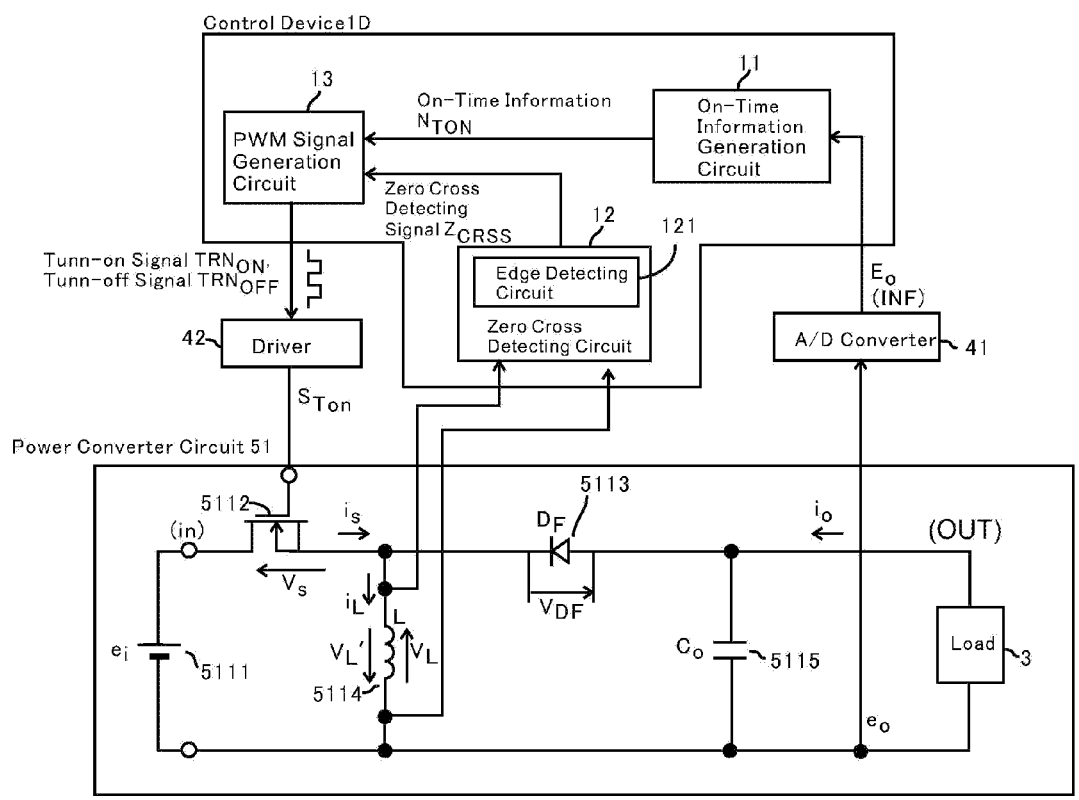
FIG. 14 is a figure showing an embodiment of the control device of the present invention applied to a boost/buck type DC/DC converter.

FIG. 14 shows other embodiment of the control device of the power converter circuit of the present invention.

In FIG. 14, a control device 1D is applied to a boost/buck type DC/DC converter (a power converter circuit 51).

Figure 15:
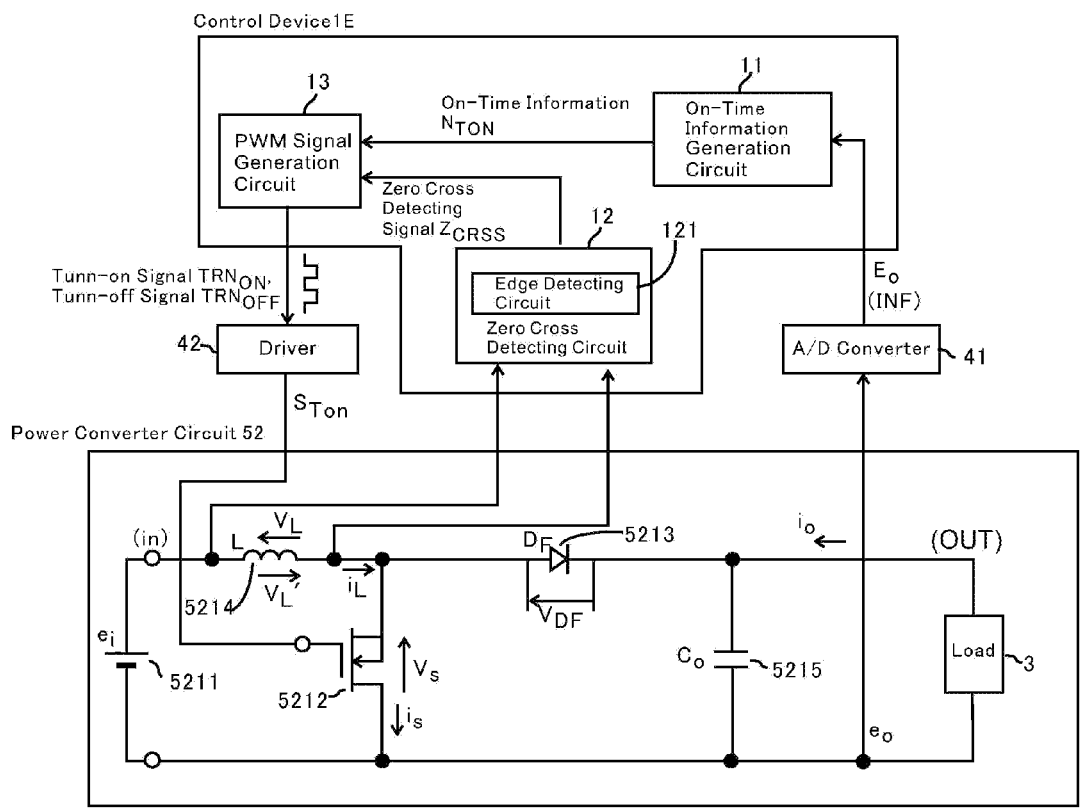
FIG. 15 is a figure showing an embodiment of the control device of the present invention applied to a boost type DC/DC converter.

FIG. 15 shows other embodiment of the control device of the power converter circuit of the present invention.

In FIG. 15, a control device 1E is applied to a boost type DC/DC converter (a power converter circuit 52).

An effect of the control device 1D of FIG. 14 or the control device 1E of FIG. 15 is the same as an effect of the control device in the first embodiment.

In the control device 1D of FIG. 14 and the control device 1E of FIG. 15, a differential circuit can be provided in input side of the edge detecting circuit 121, and a differential amplification circuit can be provided in input side of the differential circuit in addition.

Figure 16:
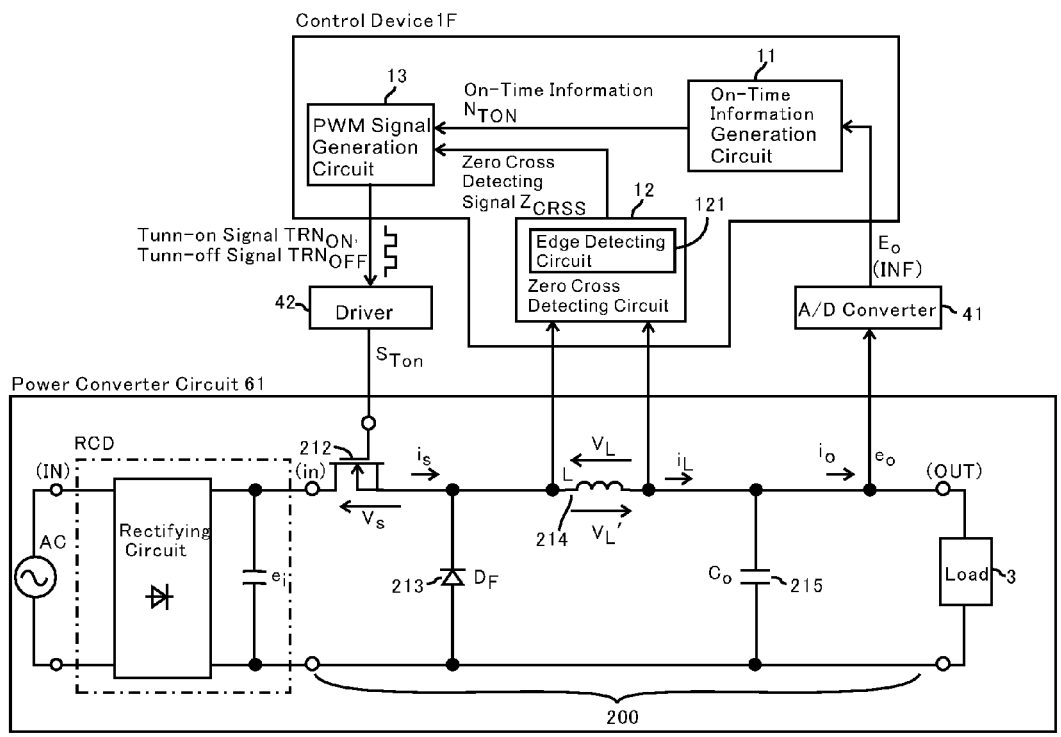
FIG. 16 is a figure showing an embodiment where a power converter circuit is an AC/DC converter including a buck type DC/DC converter.

FIG. 16 shows other embodiment of the control device of the power converter circuit of the present invention.

In FIG. 16, a control device 1F is applied to an AC/DC converter (a power converter circuit 61).

The power converter circuit 61 of FIG. 16 comprises a rectifying circuit RCD inputting an electric power and a DC/DC converter circuit 200 inputting the rectification output of the rectifying circuit RCD.

In this embodiment, the rectifying circuit RCD comprises a full wave rectifier and an output capacitor.

The rectifying circuit RCD performs full-wave rectification of a single-phase alternating current input.

The rectifying circuit RCD converts a rectified current to a pulsating current.

The structure of the DC/DC converter circuit 200 is the same as the power converter circuit 2 (a buck type DC/DC converter) of FIG. 1 without the DC power supply 211.

The control device 1F is the same as the control device 1A of FIG. 1.

The input of the DC/DC converter circuit 200 is a pulsating current, however the control device 1F detects a change of inductor current iL precisely, and a good critical mode control can be performed.

In the control device 1F of FIG. 16, a differential circuit can be provided in input side of the edge detecting circuit 121, and a differential amplification circuit can be provided in input side of the differential circuit in addition.

Figure 17:
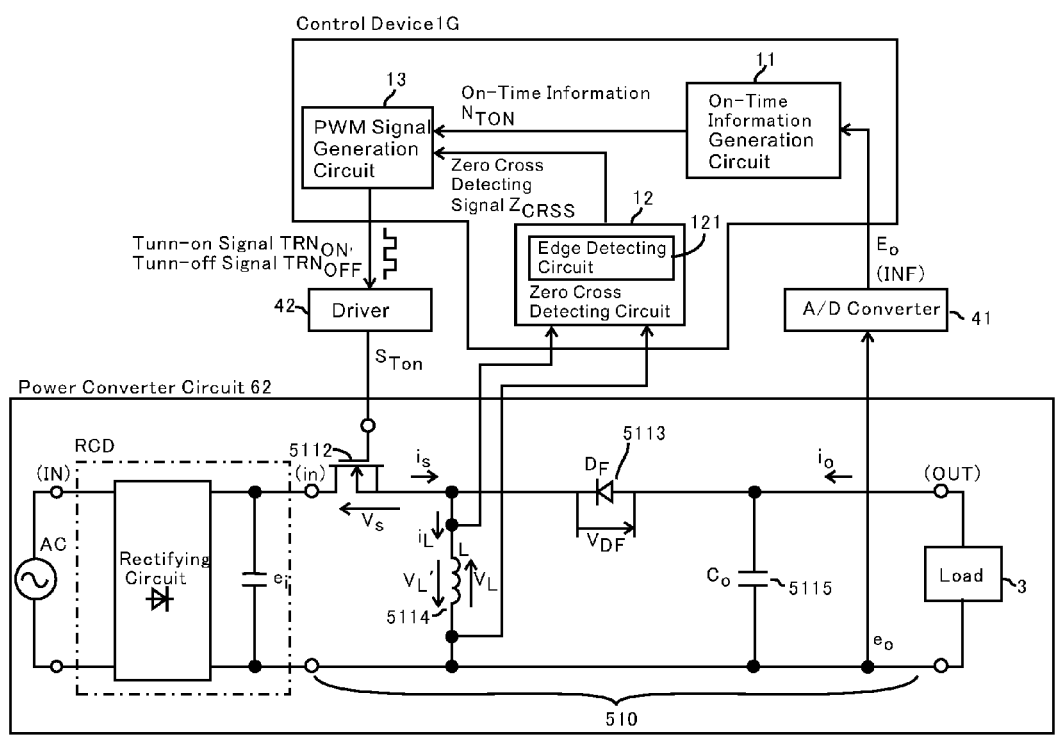
FIG. 17 is a figure showing an embodiment where a power converter circuit is an AC/DC converter including a boost/buck type DC/DC converter.

FIG. 17 shows other embodiment of the control device of the power converter circuit of the present invention.

In FIG. 17, an AC/DC converter (a power converter circuit 62) is controlled by a control device 1G The power converter circuit 62 of FIG. 17 comprises a rectifying circuit RCD and a DC/DC converter circuit 510.

The rectifying circuit RCD inputs an electric power, and the DC/DC converter circuit 510 inputs the rectification output of the rectifying circuit RCD.

The rectifying circuit RCD in FIG. 17 is the same as the rectifying circuit RCD described in FIG. 16.

The structure of the DC/DC converter circuit 510 is the same as the power converter circuit 51 (the boost/buck type DC/DC converter) of FIG. 14 without the DC power supply 5111.

The control device 1G is the same as a control device 1A of FIG. 1.

In the control device 1G of FIG. 17, a differential circuit can be provided in input side of the edge detecting circuit 121, and a differential amplification circuit can be provided in input side of the differential circuit in addition.

Figure 18:
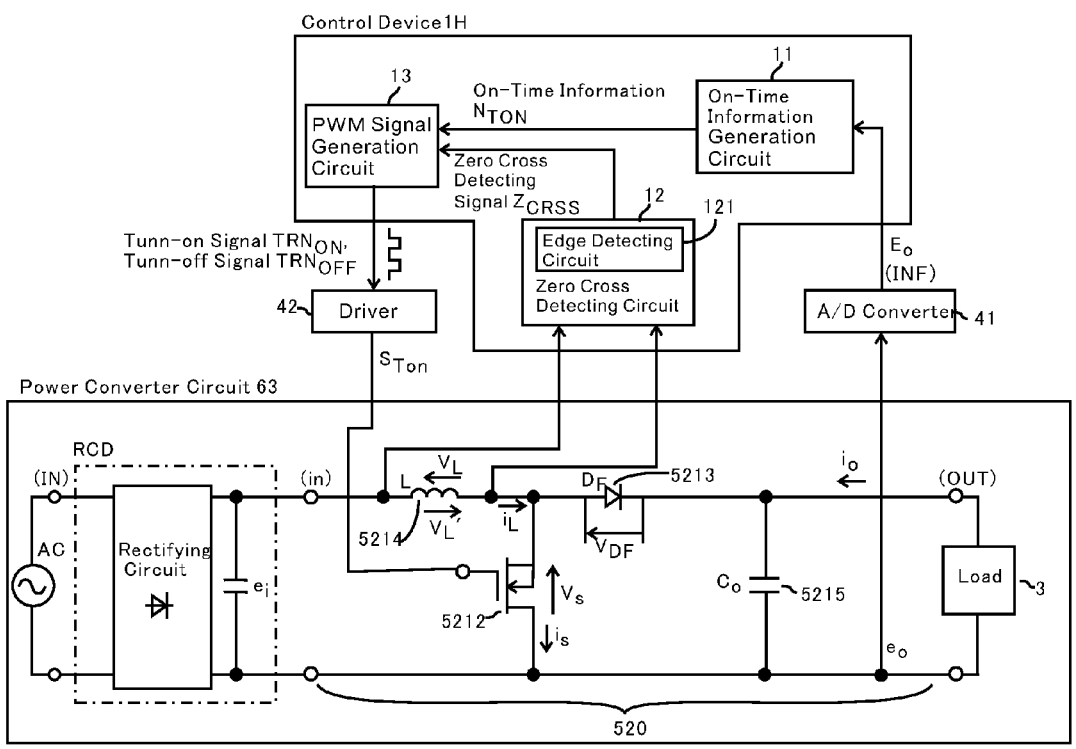
FIG. 18 is a figure showing an embodiment where a power converter circuit is an AC/DC converter including a boost type DC/DC converter.
Figure 20:
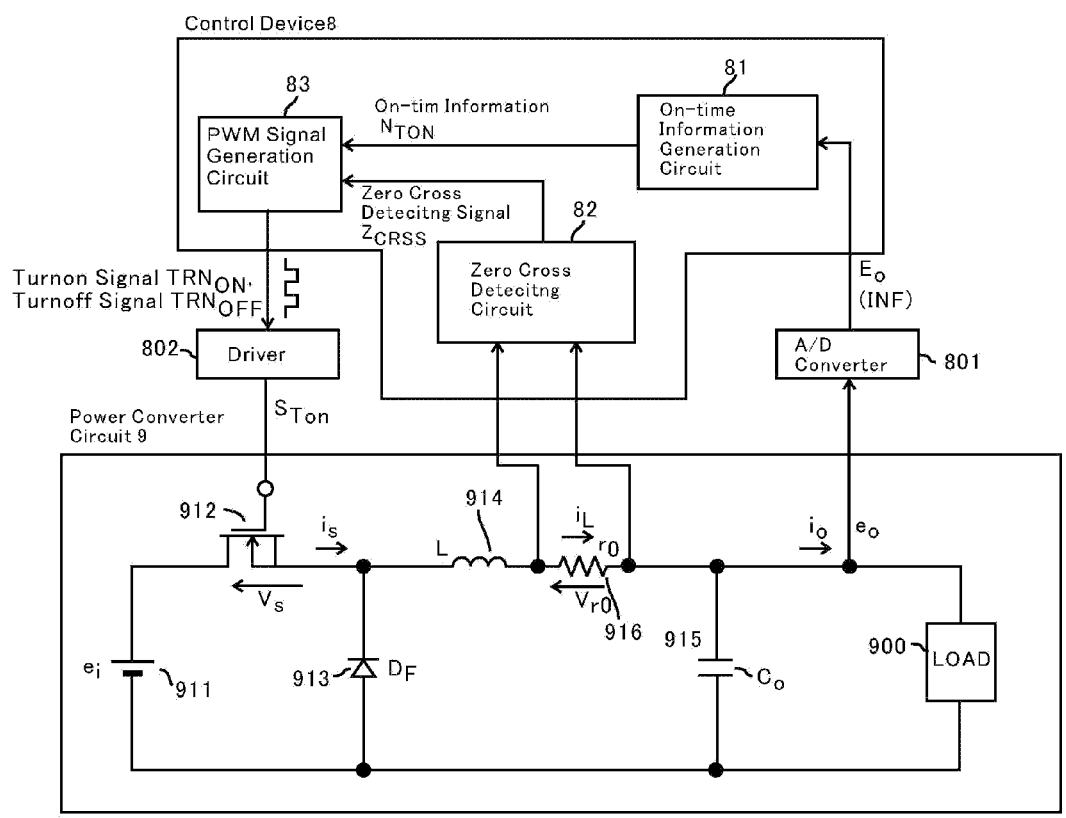
FIG. 20 is a figure showing a conventional power conversion system to work in a critical mode.

FIG. 18 shows other embodiment of the control device of the power converter circuit of the present invention.

In FIG. 18, an AC/DC converter (a power converter circuit 63) is controlled by a control device 1H.

The power converter circuit 63 of FIG. 18 comprises a rectifying circuit RCD and a DC/DC converter circuit 520.

The rectifying circuit RCD inputs an electric power, and the DC/DC converter circuit 520 inputs the rectification output of the rectifying circuit RCD.

A rectifying circuit RCD in FIG. 18 is the same as the rectifying circuit RCD described in FIG. 16.

The structure of the DC/DC converter circuit 520 is the same as the power converter circuit 52 (the boost type DC/DC converter) of FIG. 15 without the DC power supply 5211.

The control device 1H is the same as a control device 1A of FIG. 1.

In the control device 1H of FIG. 18, a differential circuit can be provided in input side of the edge detecting circuit 121, and a differential amplification circuit can be provided in input side of the differential circuit in addition.

Note that output terminal (OUT) of the power converter circuit 61, 62 or 63 (AC/DC converters) can be connected to an input terminal (in) of the buck type DC/DC converter (the power converter circuit 2) of FIG. 1, an input terminal (in) of the boost/buck type DC/DC converter (the power converter circuit 51) of FIG. 14, or an input terminal (in) of the boost type DC/DC converter (the power converter circuit 52) of FIG. 15.

In the same way, the output terminal (OUT) of the power converter circuit 51 or 52 (DC/DC converter) can be connected to an input terminal (in) of the buck type DC/DC converter (power converter circuit 2) of FIG. 1, an input terminal (in) of the boost/buck type DC/DC converter (the power converter circuit 51) of FIG. 14, or an input terminal (in) of the boost type DC/DC converter (power converter circuit 52) of FIG. 15.

EXPLANATIONS OF THE LETTERS OF NUMERALS 1A, 1B, 1C, 1D, 1E, 1F, 1G, 1H, 8: control device
2, 6, 9, 51, 52, 61, 62, 63: power converter circuit
3,900: load
11,81: on-time information generation circuit
12, 82: zero cross detecting circuit
13, 83: PWM signal generation circuit
14: delay circuit
214, 914: inductor
41, 801: A/D converter
42, 802: driver
121: edge detecting circuit
122: differential circuit
123: differential amplification circuit
131: preset counter
132, 1212: flip-flop circuit
200, 510, 520: DC/DC converter circuit
211,911, 5111, 5211: DC power supply
212,912: switch
213,913: flywheel diode
215,915: capacitor
916: resistance for inductor current detection
1211: constant voltage circuit
CF: output terminal of the preset counter
OP1, OP2: operational amplifier
Q1, Q2: output terminal of the flip-flop circuit
R1, R2: reset terminal of the flip-flop circuit
RCD: rectifying circuit
Ra1, Rd1: input resistance of the operational amplifier
Ra4, Rd2: feedback resistance of the operational amplifier
ZD: diode

The invention claimed is:

1. A control device of a power converter circuit which has an inductor and a switch or switches and repeats accumulation of energy to an inductor at each turn on timing of the switch or switches and release of the energy from the inductor to output an output voltage at each turn off timing of the switch or switches, comprising:

an on-time information generation circuit which receives a power converter circuit information including at least the output voltage from the power converter circuit, and generates an on-time information of the switch or switches as a numerical number;

a zero cross detecting circuit which detects a time when a current flowing through the inductor becomes zero by inputting a voltage between both terminals of the inductor, and generates a zero cross detection signal when the current becomes zero; and a PWM signal generation circuit which receives the on-time information and the zero cross detection signal, and generates a turn on signal and a turn off signal, wherein the zero cross detecting circuit comprises an edge detecting circuit and a differential circuit, the differential circuit is placed in input side of the edge detecting circuit, and the zero cross detecting circuit generates the zero cross detecting signal when the edge detecting circuit detects an edge of the voltage between both terminals of the inductor based on a differential voltage signal generated by the differential circuit; and the PWM signal generation circuit generates the turn on signal when the zero cross detecting signal is received, and generates the turn off signal when a time based on the on-time information is passed, wherein the edge detecting circuit comprises a constant voltage circuit and a flip-flop circuit.

2. The control device of the power converter circuit according to claim 1:

wherein differential amplification circuit is provided in input side of the differential circuit.

3. The control device of the power converter circuit according to claim 1:

wherein the current flowing through the inductor is controlled be zero for a predetermined time.

4. The control device of the power converter circuit according to claim 2:

wherein the current flowing through the inductor is controlled to be zero for a predetermined time.

\* \* \* \* \*